United States Patent
Im et al.

(10) Patent No.: US 9,695,522 B2
(45) Date of Patent: Jul. 4, 2017

(54) DEPOSITION MASK, METHOD OF MANUFACTURING DEPOSITION MASK, AND METHOD OF MANUFACTURING DISPLAY APPARATUS

(71) Applicant: Samsung Display Co., Ltd., Yongin-si (KR)

(72) Inventors: Sungsoon Im, Yongin-si (KR); Kyu H. Hwang, Yongin-si (KR); Jaesik Kim, Yongin-si (KR); Minho Moon, Yongin-si (KR); Youngmin Moon, Yongin-si (KR); Soonchul Chang, Yongin-si (KR); Taewook Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/947,714

(22) Filed: Nov. 20, 2015

(65) Prior Publication Data

US 2016/0145762 A1    May 26, 2016

(30) Foreign Application Priority Data

Nov. 21, 2014  (KR) ........................ 10-2014-0163717
Nov. 6, 2015   (KR) ........................ 10-2015-0155870

(51) Int. Cl.
*C25D 21/12*   (2006.01)
*B05B 15/04*   (2006.01)
(Continued)

(52) U.S. Cl.
CPC .............. *C25D 1/10* (2013.01); *B05B 15/045* (2013.01); *B05C 21/005* (2013.01); *H01L 51/0011* (2013.01)

(58) Field of Classification Search
CPC ....... B05C 21/005; B05B 15/045; C25D 1/10; H01L 27/3248; H01L 27/3274; H01L 51/001; H01L 51/56
(Continued)

(56) References Cited

U.S. PATENT DOCUMENTS 6,433,303 B1    8/2002  Liu et al.
2003/0221613 A1*  12/2003  Kang ..................... C25D 1/10
                                                118/504
(Continued)

FOREIGN PATENT DOCUMENTS

JP    2012-026935        2/2012
JP    2014-133934 A  *  7/2014
(Continued)

OTHER PUBLICATIONS

Computer-generated translation of JP 2014-133934 (Jul. 2014).*

*Primary Examiner* — John A McPherson
(74) *Attorney, Agent, or Firm* — H.C. Park & Associates, PLC

(57) ABSTRACT

A deposition mask including a mask body including a plurality of pattern holes; a plurality of protrusions protruding from the mask body; and a plurality of grooves formed in the mask body. A grain size of the mask body is in arrange of about 10 μm to about 1000 μm, and a difference between a maximum height of the plurality of protrusions and a maximum height of the plurality of grooves is equal to or less than 0.5 μm.

29 Claims, 5 Drawing Sheets

(51) Int. Cl.
    *C25D 1/10*    (2006.01)
    *B05C 21/00*   (2006.01)
    *H01L 51/00*   (2006.01)

(58) Field of Classification Search
    USPC ............ 205/70; 430/320, 321, 945; 445/24;
                          219/121.7, 121.71, 121.77
    See application file for complete search history.

(56) References Cited

U.S. PATENT DOCUMENTS

| | | | | |
|---|---|---|---|---|
| 2014/0033974 A1* | 2/2014 | Hong | .................... | B05C 21/005 |
| | | | | 118/500 |
| 2014/0060428 A1* | 3/2014 | Fujisawa | ................. | C22C 38/02 |
| | | | | 118/500 |
| 2014/0331925 A1* | 11/2014 | Han | ...................... | C23C 14/042 |
| | | | | 118/504 |
| 2015/0068455 A1* | 3/2015 | Lee | ...................... | B05C 21/005 |
| | | | | 118/504 |

FOREIGN PATENT DOCUMENTS

| KR | 10-2001-0095011 | 11/2001 |
|---|---|---|
| KR | 10-2011-0093351 | 8/2011 |
| KR | 10-2013-0025237 | 3/2013 |
| KR | 10-1243038 | 3/2013 |
| KR | 10-2013-0037482 | 4/2013 |

* cited by examiner

DEPOSITION MASK, METHOD OF MANUFACTURING DEPOSITION MASK, AND METHOD OF MANUFACTURING DISPLAY APPARATUS

CROSS-REFERENCE TO RELATED APPLICATION

This application claims priority from and the benefit of Korean Patent Application No. 10-2014-0163717, filed on Nov. 21, 2014, and Korean Patent Application No. 10-2015-0155870, filed on Nov. 6, 2015, which are both hereby incorporated by reference for all purposes as if fully set forth herein.

BACKGROUND

Field

Exemplary embodiments relate to a deposition mask. More particularly, exemplary embodiments relate to a method of manufacturing the deposition mask, and a method of manufacturing a display apparatus.

Discussion of the Background

Mobile electronic devices have a wide range of uses. A tablet personal computer (PC) has been recently used as a mobile electronic device, in addition to a small electronic device, such as a mobile phone.

A mobile electronic device includes a display unit for providing visual information, such as images or moving images to users in order to support various functions. Because components for driving the display unit have recently become smaller, a portion of the display unit that occupies in an electronic device has increased, and a structure of the display unit that may be bent to have a predetermined angle from a flat state has been developed.

To form the above-described display unit, each of layers may be formed using various methods. In this regard, methods of forming each layer may include a deposition method, a photomask process, etc.

In the deposition method, a process of vaporizing, spraying, and depositing a deposition material may generally include placing a deposition source in a lower portion, placing a mask on the deposition source, placing a substrate on the mask, and depositing the deposition material that has passed through the mask onto the substrate.

It is necessary to finely process pattern holes that are formed in the mask and allow the deposition material to pass through in order to manufacture a display apparatus panel that has both a large size and high resolution. Precision of such pattern holes may determine precision of a pattern of the deposition material. In particular, the pattern of the deposition material is a very important issue in terms of resolution of the display unit or performance thereof, and may determine a product quality. Thus, various apparatuses and methods are applied in order to increase the precision of the pattern of the deposition material.

As an example, a parent metal of the deposition mask is manufactured through a rolling process and then an etching or laser irradiation process for processing pattern holes, and thus, the mask may be finally manufactured.

However, when the mask is manufactured using a parent metal of the deposition mask manufactured through the rolling process, there is a problem in that pattern holes may not be processed in a region where the pattern holes need to be processed, or a defect may occur in a shape of the pattern holes.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a deposition mask, a method of manufacturing the deposition mask, and a method of manufacturing a display apparatus.

Additional aspects will be set forth in part in the description which follows and, in part, will be apparent from the description, or may be learned by practice of the presented embodiments.

An exemplary embodiment of the present invention discloses a deposition mask including a mask body including a plurality of pattern holes; a plurality of protrusions protruding from the mask body; and a plurality of grooves formed in the mask body. A grain size of the mask body may be in a range of about 10 μm to about 1000 μm, and a difference between a maximum height of the plurality of protrusions and a maximum height of the plurality of grooves is equal to or less than 0.5 μm.

An exemplary embodiment also discloses a method of manufacturing a deposition mask including processing a parent metal of the deposition mask by performing an electro-forming process; placing the parent metal of the deposition mask between a stage and a beam splitter configured to split a laser beam oscillated by a laser oscillator into a plurality of laser beams; placing an optical mirror configured to be penetrated by at least some of the plurality of laser beams between the parent metal and the beam splitter; and processing pattern holes in the parent metal by irradiating the plurality of laser beams onto a part of the parent metal exposed by the optical mirror through a scanner that adjusts an irradiation direction of the plurality of laser beams that have passed through the beam splitter.

An exemplary embodiment also discloses a method of manufacturing a display apparatus including a pixel electrode and a counter electrode that face each other on a substrate and an organic layer disposed between the pixel electrode and the counter electrode, the method including depositing the organic layer by using a deposition mask. The deposition mask includes: a mask body including a plurality of pattern holes; a plurality of protrusions protruding from the mask body; and a plurality of grooves formed in the mask body. A grain size of the mask body may be in a range of about 10 μm to about 1000 μm, and a difference between a maximum height of the plurality of protrusions and a maximum height of the plurality of grooves is equal to or less than 0.5 μm.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
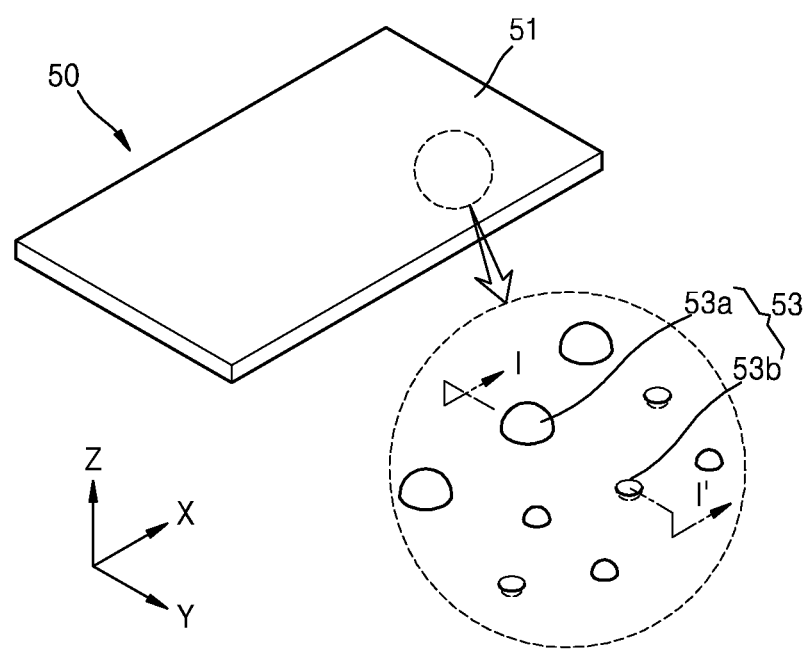
FIG. 1 is a schematic perspective view of a parent metal of the deposition mask before a deposition mask is manufactured, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
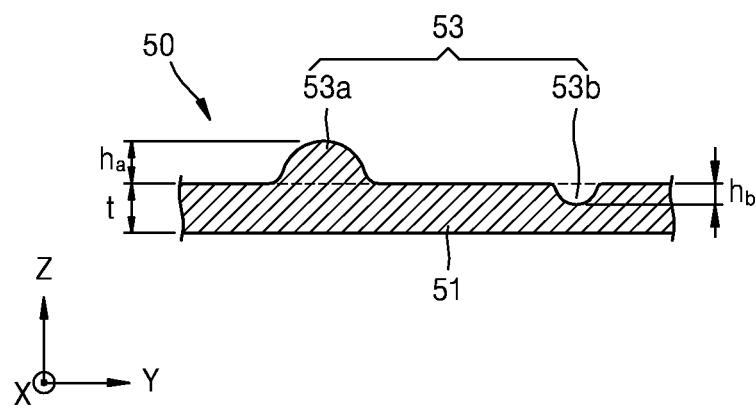
FIG. 2 is an enlarged cross-sectional view taken along a line I-I' of FIG. 1.

FIG. 1 is a schematic perspective view of a parent metal 50 of the deposition mask 150 before a deposition mask 150 (see FIG. 4) is manufactured, according to an exemplary embodiment. FIG. 2 is an enlarged cross-sectional view taken along line I-I' of FIG. 1.

Referring to FIGS. 1 and 2, the parent metal 50 may include a plurality of protrusions 53a protruding from a mask body 51, and a plurality of grooves 53b formed in the mask body 51. In this regard, a difference between a maximum height $h_a$ of the plurality of protrusions 53a and a maximum height $h_b$ of the plurality of grooves 53b may be equal to or less than 0.5 μm.

A plurality of the protrusions 53a and a plurality of the grooves 53b may be formed in a surface of the mask body 51. In this regard, the protrusions 53a and the grooves 53b are illustrated as an enlarged part of the mask body 51 in FIG. 1. Although not specifically shown, a greater number of protrusions 53a and the grooves 53b may be formed than what is shown in FIG. 1.

The protrusions 53a and the grooves 53b are illustrated as each having a hemispherical shape that protrudes from or is formed in the surface of the mask body 51 in FIG. 1, but shapes of the protrusions 53a and the grooves 53b are not limited thereto. That is, the protrusions 53a and the grooves 53b that are formed from and in the surface of the mask body 51 may extend in a length direction (X axis direction) of the parent metal 50 or a width direction (Y axis direction) thereof. However, for convenience of description, the protrusions 53a and the grooves 53b that have the hemispherical shape and are formed from and in the surface of the mask body 51 will be described below.

The parent metal 50 of FIGS. 1 and 2 may be manufactured by performing a rolling process. In more detail, the rolling process includes processing a metal plate by passing a metal material at a high or room temperature through two rotating rollers by using a plasticity of metal. Although the rolling process has a characteristic of being quick while incurring low production costs, when the parent metal 50 of FIG. 1 is manufactured by performing the rolling process, the protrusions 53a and the grooves 53b may not have the height difference of 0.5 μm.

Instead, the parent metal 50 of FIG. 1 according to an exemplary embodiment may be manufactured through an electro-forming process. In more detail, the electro-forming process includes processing a metal electro-deposition layer by using a phenomenon that if a negative electrode and a positive electrode are electrically connected by facing the negative electrode and the positive electrode together in an electrolyte, metal ions are discharged from the negative electrode and electro-deposited on the positive electrode. When the parent metal 50 is manufactured through the electro-forming process, since the protrusions 53a and the grooves 53b may have the height difference equal to or less than 0.5 μm, the surface of the mask body 51 may be relatively uniform, compared to the rolling process of the related art.

Figure 4:
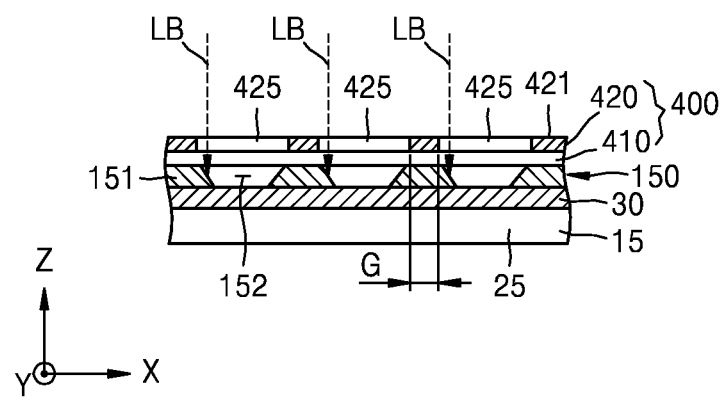
FIG. 4 is an enlarged cross-sectional view taken along a line II-II' of FIG. 3.

As illustrated in FIG. 4, laser beams LB may be irradiated onto the parent metal 50 to manufacture the deposition mask 150. If the laser beams LB is irradiated onto the parent metal 50 that is manufactured through the rolling process, the laser beams LB irradiated onto the parent metal 50 may suffer from being de-focused as a result of a step structure caused by a height difference between the protrusions 53a and the grooves 53b that are present on and in the parent metal 50. Because the shapes of pattern holes processed by the laser beams LB are modified, when the laser beams LB irradiated onto the parent metal 50 are de-focused, a defect is highly likely to occur.

However, when the parent metal 50 is manufactured through the electro-forming process according to the exemplary embodiments, since the surface of the mask body 51 is uniformly formed, a defect rate of the pattern holes formed in the parent metal 50 may be remarkably improved.

According to a current trend for a display apparatus to have a large size and high resolution display, it is advantageous for a deposition mask used to deposit various deposition materials on a panel of the display apparatus to be relatively thin. In general, a display apparatus having an ultra-HD (UHD) high quality resolution may not be currently manufactured using a deposition mask having a thickness of more than 50 μm. However, the parent metal 50 manufactured through the electro-forming process according to an exemplary embodiment may be manufactured to have a thickness t ranging from about 5 μm to about 50 μm. Pattern holes 152 (see FIG. 4) may be formed by irradiating the laser beams LB onto the parent metal 50 having the thickness t ranging from about 5 μm to about 50 μm, thereby manufacturing the deposition mask 150.

The parent metal 50 manufactured through the electro-forming process may include an invar alloy containing nickel ranging from about 30 wt % to about 50 wt %. In more detail, the parent metal 50 including the invar alloy may be formed to have a grain size ranging from about 10 μm to about 1000 μm.

In detail, the grain size is a scale indicating an average size of crystal grains that are a group of crystals having different crystal directions. The grain size may be determined by measuring the number of 2-dimensional crystal grains contained in a foreground area (635 mm$^2$), in which a length of one side is 25 mm, of a microscope picture of an enlarged crystal grain.

In general, the invar alloy manufactured through the rolling process has a grain is size of several micrometers (μm). Because fine pattern holes may not be formed in the parent metal 50, when a parent metal 50 having the grain size of several micrometers is used to manufacture a deposition mask, a non-processed region may be generated. This is because during a process of ablating a part of the parent metal 50 by using the laser beams LB, since the ablated part of the parent metal 50 remains in the form of dust, a light path of the laser beams LB may be blocked.

When the parent metal 50 that is manufactured through the electro-forming process, and having the grain size ranging from about 10 μm to about 1000 μm, is used to manufacture the deposition mask 150, the fine pattern holes 152 may be formed in the parent metal 50. In more detail, in consideration of factors such as manufacturing costs, process convenience, time taken, etc., the parent metal 50 may be processed to have a grain size equal to or greater than 10 nm. To prevent the non-processed region from being generated, i.e., to form the fine pattern holes 152, the parent metal 50 may be processed to have a grain size equal to or smaller than 1000 nm.

Figure 3:
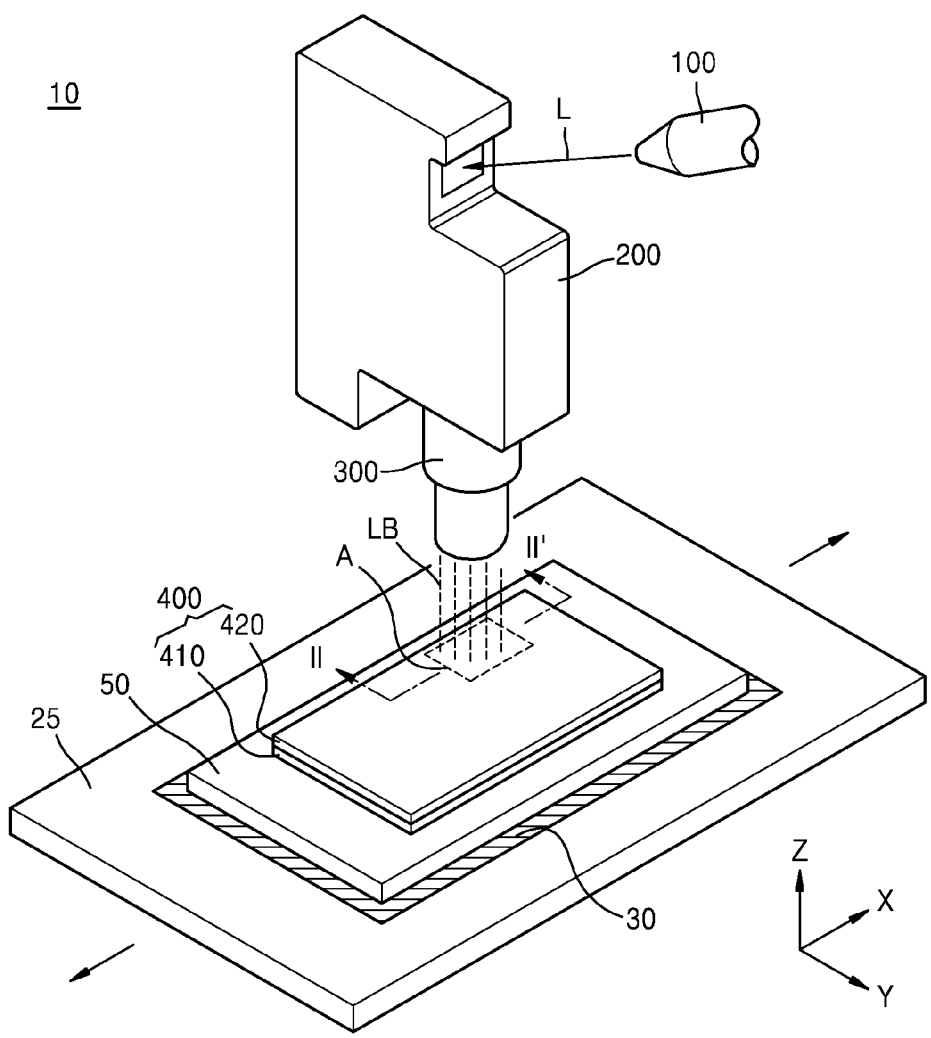
FIG. 3 is a schematic conceptual diagram of a deposition mask manufacturing apparatus that performs a deposition mask manufacturing method, according to another exemplary embodiment.

FIG. 3 is a schematic conceptual diagram of a deposition mask manufacturing apparatus 10 that performs a deposition mask manufacturing method, according to another exemplary embodiment.

Referring to FIG. 3, the deposition mask manufacturing apparatus 10 may include a laser oscillator 100, a beam splitter 200, a scanner 300, and an optical mirror 400.

The laser oscillator 100 may oscillate laser beam L toward the beam splitter 200, where the laser beam L is an energy source for processing the pattern holes 152 in the parent metal 50 that will be described later.

The beam splitter 200 may split the laser beam L oscillated by the laser oscillator 100 into the plurality of laser beams LB. The plurality of split laser beams LB may be used to process the pattern holes 152 of FIG. 4 that will be described later. In detail, some of the split laser beams LB may be reflected from the optical mirror 400 that will be described later, and others thereof may be irradiated onto the parent metal 50 to process the pattern holes 152. The plurality of laser beams LB oscillated by the laser oscillator 100 may be irradiated onto the parent metal 50 in a vertical direction.

The scanner 300 may control irradiation directions of the plurality of laser beams LB that have passed through the beam splitter 200. In detail, the parent metal 50 of the deposition mask 50 may be fixed to a stage 25 during a process of processing the pattern holes 152 when the laser beams L are irradiated onto the parent metal 50. The scanner 300 may be driven to be movable within a range corresponding to an area of the pattern holes 152 that are to be processed. Such driving of the scanner 300 may allow each laser beam LB to be precisely irradiated onto the parent metal 50, and thus, the fine pattern holes 152 may be formed.

Thereafter, the optical mirror 400 may be disposed between the scanner 300 and the parent metal 50 to allow some of the plurality of laser beams LB that have passed through the scanner 300 to penetrate the optical mirror 400. In more detail, the optical mirror 400 may include a penetration layer 410 that allows some of the plurality of laser beams LB to penetrate the optical mirror 400, and a reflection layer 420 that reflects others thereof.

The deposition mask manufacturing apparatus 10 may further include an electrostatic chuck 30 that adsorbs the parent metal 50. The electrostatic chuck 30 may be covered by the stage 25 that supports the parent metal 50 as shown in FIG. 3, but the present invention is not limited thereto. For example, the electrostatic chuck 30 may be connected to an upper portion of the stage 25 so that a separate member may be disposed between the stage 25 and the parent metal 50. The electrostatic chuck 30 may adsorb the parent metal 50 to fix the parent metal 50 onto the stage 25 such that the parent metal 50 does not move on the stage 25 during the process of processing the pattern holes 152 in the parent metal 50.

It may be necessary to accurately align the optical mirror 400 and the parent metal 50 in order to precisely irradiate the laser beams LB onto locations of the pattern holes 152 that are to be processed in the parent metal 50.

To this end, the deposition mask manufacturing apparatus 10 may further include a camera (not shown) that monitors locations of the optical mirror 400 and the parent metal 50 and a driver (not shown) that moves at least one of the optical mirror 400 and the parent metal 50 and aligns the locations of the optical mirror 400 and the parent metal 50.

Although not shown in FIG. 3, the camera may be placed in a chamber (not shown) that accommodates the deposition mask manufacturing apparatus 10 and may be installed at any location where the locations of the optical mirror 400 and the parent metal 50 may be monitored. The driver may be connected to the parent metal 50 such that the parent metal 50 may be conveyed into the chamber and may be connected to the optical mirror 400 so that the optical mirror 400 may be moved in relation to the parent metal 50.

The penetration layer 410 and the reflection layer 420 of the optical mirror 400 will be described in detail with reference to FIGS. 4 through 6 below. The deposition mask 150 of FIG. 4 is a resulting structure obtained by processing the parent metal 50 of FIG. 3 by using the laser beams LB and forming the pattern holes 152 in the parent metal 50.

FIG. 4 is an enlarged cross-sectional view taken along a line II-II' of FIG. 3. FIG. 5 is an enlarged perspective view of a region A of FIG. 3. FIG. 6 is an enlarged plan view of a region B of FIG. 5.

The optical mirror 400 may be manufactured by performing a photolithography process. For example, the photolithography process includes obtaining a desired pattern by coating a thin photoresist on a surface of a structure in which a plurality of layers are stacked, light exposing a photomask having the pattern that is to be formed on the photoresist, and selectively etching an exposed region and a non-exposed region. Openings 425 may be formed by partially etching the reflection layer 420 disposed on the penetration layer 410 through the photolithography process.

The penetration layer 410 may be continuously exposed to the laser beams LB during the processing of the pattern holes 152 in the parent metal 50, and thus, the penetration layer 410 may include a material having excellent heat resistance and light penetration. For example, the penetration layer 410 may include at least one of quartz and glass that have excellent heat resistance and simultaneously may allow light to penetrate.

Thereafter, the reflection layer 420 may be disposed between the penetration layer 410 and the scanner 300, and may include an opaque metal that may reflect some of the laser beams LB. In this regard, the openings 425 may be formed in the reflection layer 420 by passing through the reflection layer 420 such that the laser beams LB may pass through the reflection layer 420.

A plurality of the openings 425 may be formed in the parent metal 50 such that the openings 425 may correspond to a shape of the pattern holes 152 formed in the parent metal 50. Although only the six openings 425 are illustrated in FIG. 5, since FIG. 5 is an enlarged perspective view of the predetermined region A of FIG. 3 of the optical mirror 400, the number of the openings 425 formed in the optical mirror 400 is not limited thereto, and the number of the openings 425 may correspond to the number of laser beams LB irradiated by the beam splitter 200.

The penetration layer 410 may support the reflection layer 420 in which the openings 425 are formed. The penetration layer 410, except for a part exposed by the openings 425, may be covered by the reflection layer 420. Thus, only a part of the penetration layer 410 corresponding to the shape of the pattern holes 152 that are to be formed in the parent metal 50 may be exposed to the laser beams LB by the openings 425 of the reflection layer 420.

In more detail, the laser beams LB irradiated onto the reflection layer 420 are entirely reflected and do not pass through the penetration layer 410, whereas since the laser beams LB irradiated to the openings 425 are not in contact with the reflection layer 420, the laser beams LB may sequentially penetrate the penetration layer 410 and may be irradiated onto the parent metal 50.

In this regard, in the case of the laser beams LB irradiated onto boundary surfaces between a surface 421 of the reflection layer 420 and the openings 425, i.e., when some laser beams LB are irradiated onto the surface 421 of the reflection layer 420, and others are irradiated onto the openings 425, only the other laser beams LB irradiated onto the openings 425 may be used to penetrate the penetration layer 410 via the openings 425 and process a surface of the parent metal 50.

A unit area of the pattern holes 152 processed using the laser beams LB in a horizontal direction may be different along a vertical direction of the pattern holes 152. In this regard, the horizontal direction refers to an X axis direction that is a length direction of the deposition mask 150, and the vertical direction refers to a +Z axis direction that is a thickness direction of the deposition mask 150. That is, an inner surface of the pattern holes 152 may include an inclination surface.

Figure 5:
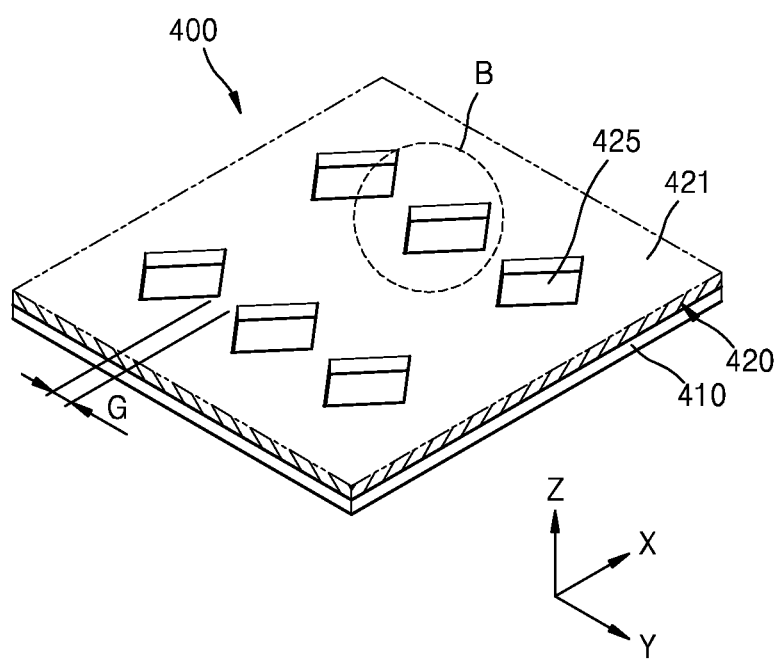
FIG. 5 is an enlarged perspective view of a region A of FIG. 3.
Figure 6:
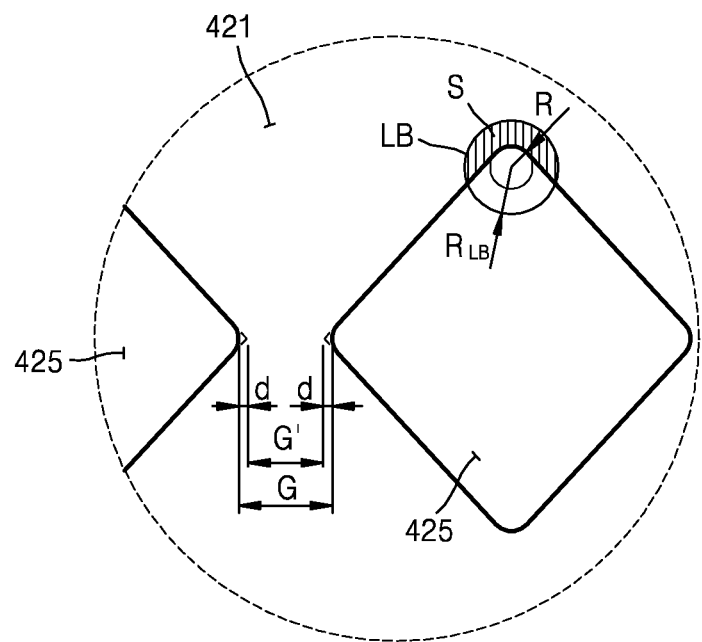
FIG. 6 is an enlarged plan view of a region B of FIG. 5.

Referring to FIGS. 5 and 6, the openings 425 may be processed in a rectangular shape, and may be spaced apart from each other by a gap G. Meanwhile, a shape of the openings 425 is not limited thereto. The openings 425 may be processed in various shapes such as a polygonal shape, a circular shape, an oval shape, etc. However, for convenience of description, the openings 425 having the rectangular shape shown in FIGS. 5 and 6, and will be described in detail below.

In detail, the gaps G between the openings 425 may be different according to the radius of curvature R of each of the openings 425. That is, the smaller the radius of curvature R of each of the openings 425, the closer to being a right angle the corners of the openings 425 are. If the corners of the openings 425 are formed closer to being the right angle, the gaps G between the openings 425 may be also relatively closer (see reference numeral G').

On the contrary, if the radius of curvature R of each of the openings 425 increases, a gap d may be further formed compared to a case where the openings 425 are formed to have a rectangular shape (see reference numeral G'). In this case, the openings 425 may be spaced apart from each other by a gap 2d compared to the case where the openings 425 are formed to have the rectangular shape.

If the laser beams LB are directly irradiated onto the parent metal 50 without the optical mirror 400, each of corners of the pattern holes 152 formed in the parent metal 50 may correspond to a shape of the laser beams LB. This is because the corners of the pattern holes 152 need to correspond to the shape of the laser beams LB according to a characteristic of the laser beams LB formed in a circular shape having a predetermined diameter.

To solve this problem, the deposition mask manufacturing apparatus 10 may include the optical mirror 400 that allows the laser beams LB to selectively penetrate. As described above, the optical mirror 400 may allow the laser beams LB that are irradiated in a direction of the parent metal 50 to selectively penetrate or reflect off the optical mirror 400.

Therefore, if the radius of curvature R of each of the openings 425 formed in the reflection layer 420 of the optical mirror 400 is smaller than a radius $R_{LB}$ of the laser beams LB, some of the laser beams LB irradiated onto the surface 421 of the reflection layer 420, from among the laser beams LB irradiated onto the corners of the openings 425, are reflected (a region S), whereas others of the laser beams LB irradiated onto the openings 425 may penetrate the optical mirror 400 to process the pattern holes 152.

If the radius of curvature R of each of the openings 425 is smaller than the radius $R_{LB}$ of the laser beams LB, the corners of the pattern holes 152 may be processed to correspond to a shape of the corners of the openings 425, irrespective of the shape of the laser beams LB. Thus, if the radius of curvature R of each of the openings 425 is smaller than the radius $R_{LB}$ of the laser beams LB, that is, if the corners of the openings 425 are formed closer to the right angle, a shape of the corners of the pattern holes 152 may also be formed closer to the right angle, thereby minimizing gaps between the pattern holes 152.

In this regard, the reason why it is stated that the corners of the pattern holes 152 are "formed substantially closer to being the right angle" is that it is impossible to actually form the corners of the pattern holes 152 at a right angle. That is, although the shape of the openings 425 or the pattern holes 152 may be seen by the naked eye as having the rectangular shape, since the openings 425 or the pattern holes 152 are actually very fine, when the corners of the openings 425 or the pattern holes 152 are observed through a microscope, the corners of the openings 425 or the pattern holes 152 may be formed to have the predetermined radius of curvature R, other than the right angle.

An effect obtained by forming the shape of the pattern holes 152 closer to the rectangular shape will be described below.

The pattern holes 152 may pass through a deposition material during a process of depositing the deposition material on a display panel (not shown). Thus, the shape of the pattern holes 152 may correspond to a shape of an emission unit (not shown) deposited on the display panel. Thus, if the shape of the pattern holes 152 is closer to the rectangular shape, the deposition material may also be deposited on the display panel in a shape closer to the rectangular shape.

In general, to implement an ultra high definition (UHD) high resolution display, it is necessary to maximize a region of an emission unit that emits visible ray within a predetermined region of a display panel. The emission unit may be formed of a deposition material deposited on the display panel via the pattern holes 152. Thus, as described above, the shape of each of the openings 425 that determines the shape of the pattern holes 152 may be formed to closely to resemble a rectangular shape, thereby minimizing the gaps G between the openings 425 and, furthermore, maximizing the region of the emission unit within the predetermined region of the display panel.

Therefore, when the laser beams LB are directly irradiated onto the parent metal 50 without the optical mirror 400, the radius of curvature R of each of the processed pattern holes 152 correspond to the radius $R_{LB}$ of the laser beams LB, whereas if the optical mirror 400 is provided in the deposition mask manufacturing apparatus 10 and is disposed on the parent metal 50 when the pattern holes 152 are processed, the radius of curvature R of each of the pattern holes 152 may be smaller than the radius $R_{LB}$ of the laser beams LB. Furthermore, an area of the emission unit may be maximized within the predetermined region of the display panel by depositing an organic material closer to a rectangular shape on the display panel.

Figure 7:
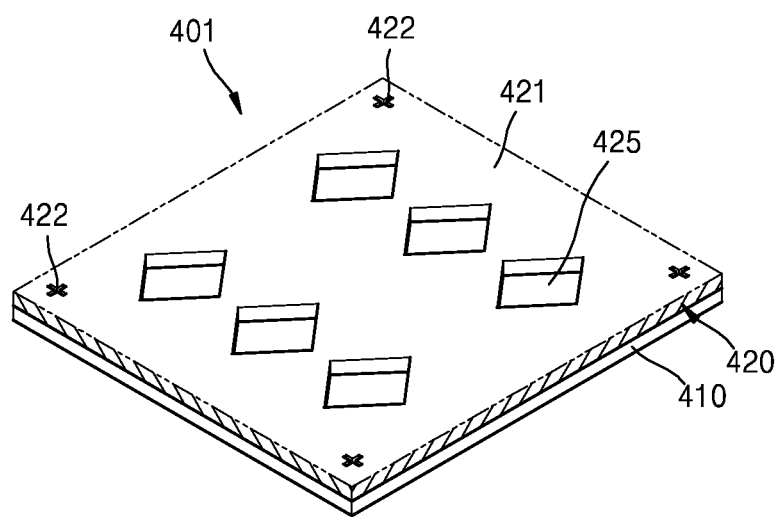
FIG. 7 is an enlarged perspective view of a modification of an optical mirror of FIG. 5.

FIG. 7 is an enlarged perspective view of a modification of the optical mirror 401 of FIG. 5.

Referring to FIG. 7, a first mark 422 in a cross shape may be formed in the optical mirror 401 in order to easily align the optical mirror 401 and the parent metal 50. A second mark (not shown) having a shape corresponding to the shape of the first mark 422 may be formed in the parent metal 50, but the shapes of the first mask 422 and the second mark are not limited thereto. For example, the first mark 422 and the second mark may be formed in various other shapes as well, such as a circular shape, an oval shape, or a polygonal shape.

In detail, the first mark 422 may be formed in one or more of the penetration layer 410 and the reflection layer 420 of the optical mirror 401. The first mark 422 may be formed in the reflection layer 420. This is because the penetration layer 410 is formed of a material that may penetrate laser such as quartz or glass, and thus, the penetration layer 410 may allow the laser beams LB to penetrate even if the first mark 422 is not formed. The second mark may be formed in the parent metal 50 such that the second mark may correspond to a shape and a location of the first mark 422.

In this regard, a camera (not shown) may monitor locations of the first mark 422 formed in the optical mirror 401 and the second mark formed in the parent metal 50, and a driver (not shown) may move one of the optical mirror 401 and the parent metal 50 and align the locations of the first mark 422 and the second mark. Thus, a preparation for irradiating the laser beams LB onto the parent metal 50 and processing the pattern holes 152 may be performed.

Thereafter, a deposition mask manufacturing method of processing the pattern holes 152 in the parent metal 50 and manufacturing a deposition mask by using the deposition mask manufacturing apparatus 10 will now be described.

The parent metal 50 may be disposed between the stage 25 and the beam splitter 200 that splits laser beam L oscillated by the laser oscillator 100 into the plurality of laser beams LB. In this regard, the stage 25 may be installed to be movable in a length direction of the parent metal 50 and may repeat driving to convey the one parent metal 50 into a chamber (not shown), processing the pattern holes 152, and conveying the one parent metal 50 out of the chamber.

The deposition mask manufacturing apparatus 10 may further include the electrostatic chuck 30 to adsorb the parent metal 50, and thus, the parent metal 50 may be closely adhered to the stage 25.

Thereafter, the optical mirror 400 may be disposed between the parent metal 50 and the beam splitter 200. In this regard, the optical mirror 400 is described in detail above, and a detailed description thereof is omitted or described in brief.

In detail, the optical mirror 400 may be disposed on the parent metal 50 so that the first mark 422 formed in the optical mirror 400 and the second mark (not shown) formed in the parent metal 50 may be aligned. When the first mark 422 and the second mark are aligned, the camera may monitor locations of the optical mirror 400 and the parent metal 50, and the driver may move one of the optical mirror 400 and the parent metal 50 and align the locations of the first mark 422 and the second mark In this regard, aligning the optical mirror 400 on the parent metal 50 may mean making a shape of the openings 425 formed in the reflection layer 420 of the optical mirror 400 correspond to a shape of the pattern holes 152 that are to be processed on the parent metal 50.

The laser oscillator 100 may be driven after the parent metal 50 and the optical mirror 400 are aligned on the stage 25. The laser beam L oscillated by the laser oscillator 100 may split into the plurality of laser beams LB, and may be guided to the scanner 300. The scanner 300 may irradiate the plurality of laser beams LB that have passed through the beam splitter 200 onto a part of the parent metal 50 exposed by the optical mirror 400 and process the pattern holes 152 in the parent metal 50.

In this regard, the scanner 300 may adjust an irradiation direction of the plurality of laser beams LB that have passed through the beam splitter 200. In detail, the laser beams LB irradiated from the beam splitter 200 to the parent metal 50 may freely move in length and width directions of the parent metal 50 in a region corresponding to a size of the pattern holes 152 by using the scanner 300 to process the pattern holes 152.

In detail, a unit area of the pattern holes 152 processed by the laser beams LB in a horizontal direction may be different along a vertical direction of the pattern holes 152. That is, an inner surface of the pattern holes 152 may include an inclination surface. To form the inclined inner surface of the pattern holes 152, an irradiation time of the laser beams LB may be increased from an edge region of the openings 425 to a center region of the openings 425 or an output of the laser beams LB may be increased, thereby irradiating stronger energy onto the center region of the openings 425.

When the laser beams LB are irradiated onto the edge region of the openings 425, the laser beams LB irradiated onto the openings 425 may pass through the openings 425, and the penetration layer 410 and may be irradiated onto the parent metal 50. The laser beams LB irradiated onto the reflection layer 420 adjacent to the openings 425 may be reflected from the reflection layer 420 and thus, are not used to process the parent metal 50.

Therefore, the shape of the pattern holes 152 may correspond to the shape of the openings 425 irrespective of the shape of the laser beams LB. This may mean that a shape of corners of the pattern holes 152 may also correspond to a shape of corners of the openings 425. That is, as described above, the optical mirror 400 may be used to process the pattern holes 152 and form the pattern holes 152 to more closely resemble a rectangular shape.

An effect obtained by forming the shape of the pattern holes 152 to more closely resemble a rectangular shape is described in detail above, and thus, a detailed description is omitted.

Figure 8:
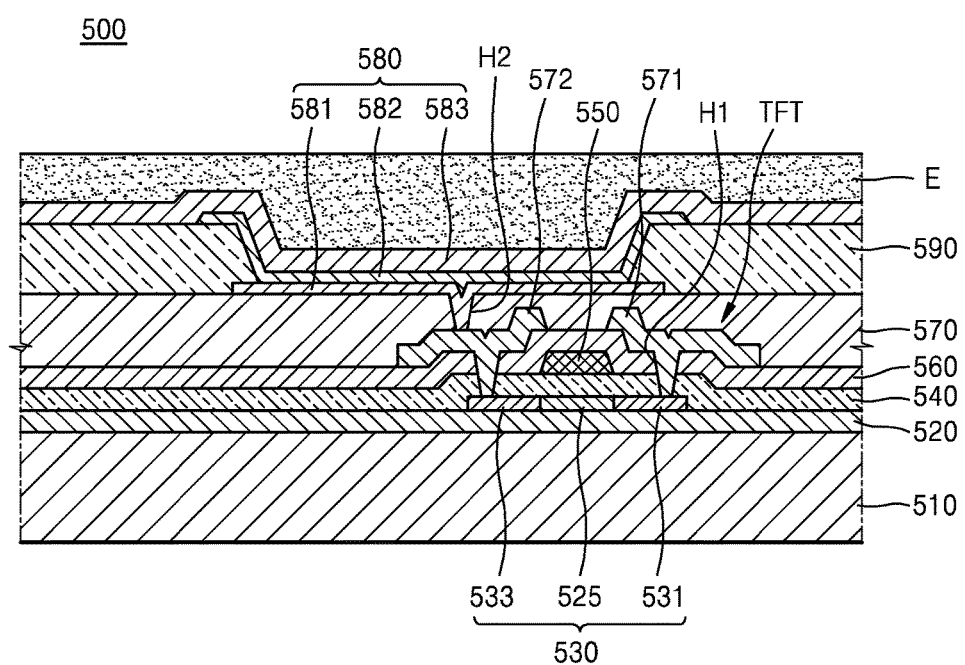
FIG. 8 is a diagram of a display apparatus manufactured using the deposition mask of FIGS. 1 and 2.

FIG. 8 is a diagram of a display apparatus 500 manufactured using a deposition mask of FIGS. 1 and 2.

Referring to FIG. 8, the display apparatus 500 may include a substrate 510 and a display unit (not shown). The display apparatus 500 may further include a thin-film encapsulation film E or an encapsulation substrate (not shown) that is formed on the display unit. In this regard, the encapsulation substrate is the same as or similar to that used in a general display apparatus, and thus, a detailed description thereof will not be given. For convenience of description, a case where the display apparatus 500 includes the thin-film encapsulation layer E will be described in detail below.

The display unit may be formed on the substrate 5510. In this regard, the display unit may include a thin-film transistor TFT, a passivation film 570 may be formed to cover the thin-film transistor TFT, and an organic light-emitting device 580 may be formed on the passivation film 570.

In this regard, the substrate 510 may be formed of a glass material but is not necessarily limited thereto. The substrate 510 may be formed of a plastic material, or a metal material, such as SUS or titanium (Ti). The substrate 510 may include ployimide (PI). For convenience of description, a case where the substrate 310 is formed of the glass material will be described in detail below.

A buffer layer 520 formed of an organic compound and/or an inorganic compound (e.g., $SiO_x$ ($x \geq 1$) or $SiN_x$ ($x \geq 1$)) may be further formed on a top surface of the substrate 510.

After an active layer 530 that is arranged to have a predetermined pattern is formed on the buffer layer 520, the active layer 530 may be covered by a gate insulating layer 540. The active layer 530 may include a source region 531 and a drain region 533, and further includes a channel region 525 that is formed between the source region 531 and the drain region 533.

The active layer 530 may include various materials. For example, the active layer 530 may include an inorganic semiconductor material, such as amorphous silicon or crystalline silicon. As another example, the active layer 530 may include an oxide semiconductor. As another example, the active layer 530 may include an organic semiconductor material. However, for convenience of description, a case where the active layer 530 is formed of amorphous silicon will be described in detail below.

The active layer 530 may be formed by forming an amorphous silicon film on the buffer layer 520, crystallizing the amorphous silicon film into a polycrystalline silicon film, and patterning the polycrystalline silicon film. The source region 531 and the drain region 533 of the active layer 530 may be doped with impurities according to a type of the thin-film transistor TFT such as a driving thin-film transistor TFT (not shown) or a switching thin-film transistor TFT (not shown).

A gate electrode 550 that corresponds to the active layer 530 and an interlayer insulating layer 560 that covers the gate electrode 550 may be formed on a top surface of the gate insulating layer 540.

After a contact hole H1 is formed in the interlayer insulating layer 560 and the gate insulating layer 540, a source electrode 571 and a drain electrode 572 may be formed on the interlayer insulating layer 560 to respectively contact the source region 531 and the drain region 533.

The passivation film 570 may be formed on the thin-film transistor TFT. A pixel electrode 581 of an organic light-emitting device (OLED) may be formed on the passivation film 570. The pixel electrode 581 may contact the drain electrode 572 of the thin-film transistor TFT through a via hole H2 that is formed in the passivation film 570. The passivation film 570 may be formed of an inorganic material and/or an organic material to have a single-layer structure or a multi-layer structure. The passivation film 570 may be formed as a planarization film having a flat top surface irrespective of a curved shape of a lower film that is disposed below the passivation film 570 or may be curved along the curved shape of the lower film. The passivation film 570 may be formed of a transparent insulator to achieve a resonance effect.

After the pixel electrode 581 is formed on the passivation film 570, a pixel-defining film 590 may be formed of an organic material and/or an inorganic material to cover the pixel electrode 581 and the passivation film 570 and to allow the pixel electrode 581 to be exposed therethrough.

An intermediate layer 582 and a counter electrode 583 may be formed on at least the pixel electrode 581.

The pixel electrode 581 may function as an anode, and the counter electrode 583 may function as a cathode. However, the polarities of the pixel electrode 581 and the counter electrode 583 may be switched, with the pixel electrode 581 functioning as the cathode and the counter electrode 583 functioning as the anode.

The pixel electrode 581 and the counter electrode 583 may be insulated from each other by the intermediate layer 582, and apply voltages having different polarities to the intermediate layer 582 such that an organic emission layer emits light. In this regard, the intermediate layer 582 may be deposited by using the deposition mask 150 according to an exemplary embodiment of FIG. 4.

In detail, the intermediate layer 582 may include the organic emission layer. Alternatively, the intermediate layer 582 may include the organic emission layer, and may further include at least one of a hole injection layer (HIL), a hole transport layer (HTL), an electron transport layer (ETL), and an electron injection layer (EIL).

The thin-film encapsulation layer E may include a plurality of inorganic layers, or an inorganic layer and an organic layer.

The organic layer of the thin-film encapsulation layer E may be formed of a polymer, and may be a single layer or stacked layers formed of one of polyethylene terephthalate, polyimide, polycarbonate, epoxy, polyethylene, and polyacrylate. More specifically, the organic layer may be formed of polyacrylate, and specifically, may include a polymerization of a monomer composition including a diacrylate-based monomer and a triacrylate-based monomer. A monoacrylate-based monomer may be further included in the monomer composition. A well-known photoinitiator such as a TPO may be further included in the monomer composition, but the present invention is not limited thereto.

The inorganic layer of the thin-film encapsulation layer E may be a single layer or stacked layers including a metal oxide or a metal nitride. In detail, the inorganic layer may include one of $SiN_x$, $Al_2O_3$, $SiO_2$, and $TiO_2$.

An uppermost layer of the thin-film encapsulation layer E that is exposed to the outside may be an inorganic layer in order to prevent moisture from penetrating into the OLED.

The thin-film encapsulation layer E may include at least one sandwich structure in which at least one organic layer is inserted between at least two inorganic layers. As another example, the thin-film encapsulation layer E may include at least one sandwich structure in which at least one inorganic layer is inserted between at least two organic layers. In still another example, the thin-film encapsulation layer E may include a sandwich structure in which at least one organic layer is inserted between at least two inorganic layers and a sandwich structure in which at least one inorganic layer is inserted between at least two organic layers.

The thin-film encapsulation layer E may sequentially include a first inorganic layer, a first organic layer, a second inorganic layer, a second organic layer, and a third inorganic layer from a top portion of the OLED.

As another example, the thin-film encapsulation layer E may sequentially include a first inorganic layer, a first organic layer, a second inorganic layer, a second organic layer, a third inorganic layer, a third organic layer, and a fourth inorganic layer from the top portion of the OLED.

A halogenized metal layer including LiF may be additionally included between the OLED and the first inorganic layer. The halogenized metal layer may prevent the OLED form being damaged when the first inorganic layer is formed using sputtering.

An area of the first organic layer may be smaller than an area of the second inorganic layer. The area of the second inorganic layer may be smaller than an area of the third inorganic layer.

As described above, according to the one or more exemplary embodiments, a deposition mask, a method of manufacturing the deposition mask, and a method of manufacturing a display apparatus may precisely process pattern holes of a deposition mask through which a deposition material passes.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A deposition mask comprising:
   a mask body comprising a plurality of pattern holes;
   a plurality of protrusions protruding from the mask body; and
   a plurality of grooves formed in the mask body,
   wherein:
   a grain size of the mask body is in a range of about 10 μm to about 1000 μm; and
   a difference between a maximum height of the plurality of protrusions and a maximum height of the plurality of grooves is equal to or less than 0.5 μm.

2. The deposition mask of claim 1, wherein the mask body comprises an invar alloy containing nickel in a range of about 30 wt % to about 50 wt %.

3. The deposition mask of claim 1, wherein a thickness of the mask body is in a range of about 5 μm to about 50 μm.

4. The deposition mask of claim 1, wherein a radius of curvature of corners of the plurality of pattern holes is smaller than a radius of a laser beam used to process the plurality of pattern holes.

5. The deposition mask of claim 1, wherein a unit area of the plurality of pattern holes in a horizontal direction is different along a vertical direction of the plurality of pattern holes.

6. The deposition mask of claim 5, wherein an inner surface of the plurality of pattern holes is inclined.

7. A method of manufacturing a deposition mask, the method comprising:
   processing a parent metal of the deposition mask by performing an electro-forming process;
   placing the parent metal of the deposition mask between a stage and a beam splitter that splits a laser beam oscillated by a laser oscillator into a plurality of laser beams;
   placing an optical mirror that is penetrated by at least some of the plurality of laser beams between the parent metal and the beam splitter; and
   processing pattern holes in the parent metal by irradiating the plurality of laser beams onto a portion of the parent metal exposed by the optical mirror through a scanner that adjusts an irradiation direction of the plurality of laser beams that have passed through the beam splitter.

8. The method of claim 7, wherein a grain size of the parent metal is in a range of about 10 μm to about 1000 μm.

9. The method of claim 7, wherein the parent metal comprises:
a plurality of protrusions protruding from a surface of the parent metal; and
a plurality of grooves formed in the surface of the parent metal,
wherein a difference between a maximum height of the plurality of protrusions and a maximum height of the plurality of grooves is equal to or less than 0.5 μm.

10. The method of claim 7, wherein the parent metal comprises an invar alloy containing nickel in a range of about 30 wt % to about 50 wt %.

11. The method of claim 7, wherein a thickness of the mask body is in a range of about 5 μm to about 50 μm.

12. The method of claim 7, wherein a unit area of the pattern holes in a horizontal direction is different along a vertical direction of the pattern holes.

13. The method of claim 12, wherein an inner surface of the pattern holes is inclined.

14. The method of claim 7, wherein the placing of the parent metal between the stage and the beam splitter comprises adsorbing the parent metal by using an electrostatic chuck disposed between the stage and the parent metal.

15. The method of claim 7, wherein the placing of the optical mirror between the stage and the beam splitter comprises aligning locations of a first mark formed in the optical mirror and a second mark formed in the parent metal to correspond to a shape of the first mark.

16. The method of claim 7, further comprising:
monitoring locations of the optical mirror and the parent metal; and
aligning the optical mirror and the parent metal by moving at least one of the optical mirror and the parent metal.

17. The method of claim 16, wherein:
a first mark is formed in the optical mirror;
a second mark corresponding to a shape of the first mark is formed in the parent metal; and
locations of the first mark and the second mark are aligned by moving at least one of the optical mirror and the parent metal.

18. The method of claim 7, wherein the plurality of laser beams that have passed through the scanner are irradiated onto the parent metal in a vertical direction.

19. The method of claim 7, wherein the optical mirror comprises:
a penetration layer configured to allow some of the plurality of laser beams to penetrate the optical mirror; and
a reflection layer configured to reflect remaining ones of the plurality of laser beams,
wherein the reflection layer comprises openings corresponding to a shape of the pattern holes.

20. The method of claim 19, wherein the penetration layer comprises at least one of quartz and glass.

21. The method of claim 19, wherein the reflection layer comprises opaque metal.

22. The method of claim 19, wherein a radius of curvature of corners of the openings is smaller than a radius of the plurality of laser beams.

23. A method of manufacturing a display apparatus comprising a pixel electrode and a counter electrode that face each other on a substrate and an organic layer disposed between the pixel electrode and the counter electrode, the method comprising depositing the organic layer by using a deposition mask, wherein:
the deposition mask comprises:
a mask body comprising a plurality of pattern holes;
a plurality of protrusions protruding from the mask body; and
a plurality of grooves formed in the mask body;
a grain size of the mask body is in a range of about 10 μm to about 1000 μm; and
a difference between a maximum height of the plurality of protrusions and a maximum height of the plurality of grooves is equal to or less than 0.5 μm.

24. The method of claim 23, wherein the mask body comprises an invar alloy containing nickel in a range of about 30 wt % to about 50 wt %.

25. The method of claim 23, wherein a thickness of the mask body is in a range of about 5 μum to about 50 μm.

26. The method of claim 23, wherein the deposition mask is manufactured by irradiating at least one laser beam onto a parent metal of the deposition mask manufactured by performing an electro-forming process and processing the plurality of pattern holes.

27. The method of claim 23, wherein a radius of curvature of corners of the plurality of pattern holes is smaller than a radius of a laser beam used to process the plurality of pattern holes.

28. The method of claim 23, wherein a unit area of the plurality of pattern holes in a horizontal direction is different along a vertical direction of the plurality of pattern holes.

29. The method of claim 23, wherein an inner surface of the plurality of pattern holes is inclined.

* * * * *